(12) United States Patent
Fang et al.

(10) Patent No.: US 11,091,691 B2
(45) Date of Patent: Aug. 17, 2021

(54) QUANTUM DOT COMPOSITION, QUANTUM DOT LUMINESCENT MATERIAL, PREPARATION METHOD THEREOF AND LIGHT-EMITTING DEVICE CONTAINING THE SAME

(71) Applicant: Najing Technology Corporation Limited, Zhejiang (CN)

(72) Inventors: Long Fang, Zhejiang (CN); Mengbing Lyu, Zhejiang (CN); Hailin Wang, Zhejiang (CN); Fei Zhao, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 58 days.

(21) Appl. No.: 16/643,518

(22) PCT Filed: Aug. 2, 2018

(86) PCT No.: PCT/CN2018/098223
§ 371 (c)(1),
(2) Date: Feb. 28, 2020

(87) PCT Pub. No.: WO2019/042068
PCT Pub. Date: Mar. 7, 2019

(65) Prior Publication Data
US 2020/0347291 A1    Nov. 5, 2020

(30) Foreign Application Priority Data
Aug. 29, 2017   (CN) .......................... 201710758363.5

(51) Int. Cl.
*C09K 11/02*  (2006.01)
*C08F 283/00*  (2006.01)
(Continued)

(52) U.S. Cl.
CPC ........ *C09K 11/025* (2013.01); *C08F 283/008* (2013.01); *C08F 283/01* (2013.01);
(Continued)

(58) Field of Classification Search
CPC ..... C09K 11/025; C09K 11/883; B82Y 20/00; B82Y 40/00
See application file for complete search history.

(56) References Cited

U.S. PATENT DOCUMENTS

| | | | | |
|---|---|---|---|---|
| 7,811,470 | B2 * | 10/2010 | Hayes .................. | C09D 133/08 252/301.36 |
| 2011/0045094 | A1 * | 2/2011 | Han ........................ | B82Y 5/00 424/497 |
| 2015/0031217 | A1 | 1/2015 | Naasani et al. | |

FOREIGN PATENT DOCUMENTS

| | | |
|---|---|---|
| CN | 103361067 A | 10/2013 |
| CN | 104945855 A | 9/2015 |

(Continued)

*Primary Examiner* — C Melissa Koslow
(74) *Attorney, Agent, or Firm* — Gang Yu

(57) ABSTRACT

The disclosure provides a quantum dot composition, a quantum dot luminescent material, a preparation method thereof and a light-emitting device containing the same. The quantum dot composition includes a microemulsion, a polymer precursor dispersing the microemulsion, wherein the microemulsion includes quantum dots, a dissolution medium dissolving the quantum dots, and an emulsifier encapsulating the dissolution medium.

20 Claims, 2 Drawing Sheets

(51) Int. Cl.
*C08F 283/01* (2006.01)
*C08G 59/50* (2006.01)
*C09K 11/88* (2006.01)
*H01L 51/50* (2006.01)
*B82Y 20/00* (2011.01)
*B82Y 30/00* (2011.01)
*B82Y 40/00* (2011.01)

(52) U.S. Cl.
CPC ........ *C08G 59/5006* (2013.01); *C09K 11/883* (2013.01); *H01L 51/502* (2013.01); *B82Y 20/00* (2013.01); *B82Y 30/00* (2013.01); *B82Y 40/00* (2013.01); *H01L 2251/30* (2013.01); *H01L 2251/50* (2013.01)

(56) References Cited

FOREIGN PATENT DOCUMENTS

| | | | |
|---|---|---|---|
| CN | 105602545 | A | 5/2016 |
| CN | 106188429 | A | 12/2016 |
| CN | 106381140 | A | 2/2017 |

\* cited by examiner

QUANTUM DOT COMPOSITION, QUANTUM DOT LUMINESCENT MATERIAL, PREPARATION METHOD THEREOF AND LIGHT-EMITTING DEVICE CONTAINING THE SAME

CROSS REFERENCE TO RELATED APPLICATIONS

This application is a national application of PCT/CN2018/098223, filed on Aug. 2, 2018. The contents of PCT/CN2018098223 are all hereby incorporated by reference.

TECHNICAL FIELD

The present disclosure relates to the field of luminescent material solutions, and in particular to a quantum dot composition, a quantum dot luminescent material, a preparation method thereof, and a light-emitting device containing the same.

BACKGROUND

Since quantum dots are very small, mostly 1-10 nm, and have a very large specific surface area as well as a large amount of unpaired electrons and unsaturated dangling bonds on the surface, they have extremely unstable chemical properties and an extremely sensitivity to oxygen molecules and water molecules. Due to the large amount of unpaired electrons and unsaturated dangling bonds on the surface of quantum dots, the stability of quantum dots is improved by the design of core-shell structure or by ligand modification on the surface of quantum dots. The type and thickness of shell and ligand have an important influence on the stability of the quantum dots.

In the synthesis process of quantum dot materials, organic solvents are generally selected for dispersion, including benzene, toluene, xylene, ethyl acetate, n-octane, n-hexane, cyclohexane, dichloroethane, dichloromethane and the like to form a clear and transparent quantum dot solution. Quantum dot powders or quantum dot adsorbed microspheres have also been reported, and they are extracted by centrifugal precipitation and then coated by inorganic particles or adsorbed by porous materials such as silica.

During the application process of quantum dots, quantum dots cannot be used alone and must be dispersed in a polymer precursor. Considering the intrinsic characteristics of the quantum dots, the polymer precursor shall have the following characteristics: (1) good compatibility with quantum dot materials, causing no quenching of quantum dots; (2) good barrier properties for water vapor and oxygen; (3) can be cured from liquid to solid under the condition of light or heat.

So far, there have been many reports on polymer precursors for dispersing quantum dots, which can be summarized into the following categories: (1) The surface of quantum dots is modified with siloxane, and silicon material is selected as the polymer precursor; it is mainly used for in-situ LED chip packaging. (2) The quantum dots are adsorbed by a porous material or the quantum dots are coated with an epoxy resin to form microspheres. (3) An acrylate monomer is selected as a polymer precursor. (4) A phase separation structure is formed; quantum dots are dispersed in a hydrophobic system (acrylic resin), and an outer layer is insulated with oxygen in a hydrophilic system (epoxy resin) to form a phase separation structure from a macroscopic perspective.

There are certain problems in the compatibility of the above polymer matrix with quantum dots, which will lead to the attenuation of quantum dot efficiency in a certain extent.

SUMMARY

A main object of the present disclosure is to provide a quantum dot composition, a quantum dot luminescent material, a preparation method thereof, and a light-emitting device containing the same to solve the problem that quantum dot luminescent material of the prior art has unstable aging performance.

To realize the above object, according to one aspect of the present disclosure, there is provided a quantum dot composition which includes: a microemulsion and a polymer precursor dispersing the microemulsion, wherein the microemulsion includes quantum dots, a dissolution medium dissolving the quantum dots, and an emulsifier encapsulating the dissolution medium.

Further, the dissolution medium is a solvent or a reactive monomer.

Further, the dissolution medium is the solvent, the quantum dots are oil-soluble quantum dots, the solvent is a non-polar organic solvent, the emulsifier is an oil-in-water emulsifier, and the polymer precursor is a water-soluble polymer precursor; preferably, the non-polar organic solvent is selected from one or more of benzene, toluene, xylene, ethyl acetate, n-octane, n-hexane, cyclohexane, n-heptane, dichloromethane, chloroform, dichloroethane and carbon tetrachloride.

Further, the dissolution medium is the solvent, the quantum dots are water-soluble quantum dots, the solvent is a polar organic solvent, the emulsifier is a water-in-oil emulsifier, and the polymer precursor is an oil-soluble polymer precursor; preferably, the polar organic solvent is selected from one or more of methanol, ethanol, propanol, isopropanol, acetone, 2-butanone, tetrahydrofuran, acetonitrile, dimethylformamide, dimethyl sulfoxide and 1,4-dioxane.

Further, the dissolution medium is the reactive monomer, the quantum dots are oil-soluble quantum dots, the reactive monomer is an oil-soluble monomer, the microemulsion further including an optional first curing agent, the emulsifier is an oil-in-water emulsifier, and the polymer precursor is a water-soluble polymer precursor; preferably, the oil-soluble monomer is selected from one or more of methyl acrylate, n-butyl acrylate, isobutyl acrylate, tert-butyl acrylate, isodecyl acrylate, cyclohexyl acrylate, 2-ethylhexyl acrylate, lauryl acrylate, isobornyl acrylate, 2-phenoxyethyl acrylate, tetrahydrofuran acrylate, docosyl acrylate, methyl methacrylate, lauryl methacrylate, 2-ethylhexyl methacrylate, cyclohexyl methacrylate, glycidyl methacrylate, isobornyl methacrylate, and stearyl methacrylate.

Further, the dissolution medium is the reactive monomer, the quantum dots are water-soluble quantum dots, the reactive monomer is a water-soluble monomer, the microemulsion further includes an optional second curing agent, the emulsifier is a water-in-oil emulsifier, and the polymer precursor is an oil-soluble polymer precursor; preferably, the water-soluble monomer is selected from one or more of 2-hydroxyethyl acrylate, 2-hydroxyethyl methacrylate, acrylic acid, methacrylic acid, N-hydroxymethyl acrylamide, 2-hydroxypropyl acrylate, 2-hydroxypropyl methacrylate, N,N-dimethyl acrylamide, and water-soluble epoxy resin.

Further, the water-soluble polymer precursor forms a water-soluble polymer matrix after curing, and the water-soluble polymer matrix is selected from one or more of a water-soluble organosilicone resin, a water-soluble epoxy resin, a water-soluble acrylic resin, and a water-soluble polyurethane resin.

Further, the oil-in-water emulsifier has an HLB value ranging from 8 to 18; preferably, the oil-in-water emulsifier is selected from one or more of sodium oleate, polyoxyethylene monostearate, polyoxyethylene lauryl ether, polyoxyethylene sorbitan monolaurate, polyoxyethylene oleyl ether, polyoxyethylene sorbitol lanolin derivative, polyoxyethylene oxypropylene stearate, polyoxyethylene cetyl alcohol, polyethylene glycol monopalmitate, polyoxyethylene fatty alcohol, polyoxyethylene oleyl alcohol, polyoxyethylene stearyl alcohol, polyoxyethylene oleyl ether, polyoxyethylene sorbitan monooleate, polyoxyethylene oleyl ether, polyoxyethylene vegetable oil, polyoxyethylene alkyl phenol, polyoxyethylene monooleate, hexaethylene glycol monostearate, and polyoxypropylene stearate.

Further, the oil-soluble polymer precursor forms an oil-soluble polymer matrix after curing, and the oil-soluble polymer matrix is selected from one or more of an oil-soluble organosilicone resin, an oil-soluble epoxy resin, an oil-soluble acrylic resin, and an oil-soluble polyurethane resin.

Further, the water-in-oil emulsifier has an HLB value ranging from 3 to 6; preferably, the water-in-oil emulsifier is selected from one or more of propylene glycol monostearate, glyceryl monostearate, hydroxylated lanolin, propylene glycol fatty acid ester, sorbitan monooleate, propylene glycol monolaurate, propylene glycol fatty acid ester, sorbitan monostearate, diethylene glycol monooleate, diethylene glycol fatty acid ester, diethylene glycol monostearate, polyoxyethylene oley ether, diethylene glycol fatty acid ester, glyceryl monostearate, and polyoxyethylene sorbitol beeswax derivative.

Further, the mass ratio of the quantum dots to the polymer precursor is 1~20:100 in the quantum dot composition; preferably, the mass ratio of the emulsifier to the polymer precursor is 0.1~10:100.

Further, the mass ratio of the emulsifier to the sum of the dissolution medium and the quantum dots is 10~30:100.

Further, the polymer precursor includes a prepolymer, a diluting monomer, and an optional third curing agent.

To realize the above object, according to one aspect of the present disclosure, there is provided a quantum dot luminescent material, the quantum dot luminescent material is prepared from any one of aforesaid quantum dot composition.

To realize the above object, according to one aspect of the present disclosure, there is provided a quantum dot luminescent material, the quantum dot luminescent material includes a polymer matrix and a microemulsion dispersed in the polymer matrix, wherein, the microemulsion includes quantum dots, a dissolution medium dissolving the quantum dots, and an emulsifier encapsulating the dissolution medium.

Further, the dissolution medium is a solvent or a reactive monomer.

To realize the above object, according to one aspect of the present disclosure, there is provided a quantum dot luminescent material, the quantum dot luminescent material includes a polymer matrix and a microemulsion dispersed in the polymer matrix, wherein, the microemulsion includes quantum dots and a polymer dispersing the quantum dots and an emulsifier encapsulating the polymer, the polymer being formed by polymerization of a reactive monomer.

To realize the above object, according to one aspect of the present disclosure, there is provided a quantum dot luminescent material, the quantum dot luminescent material includes a polymer matrix and a micropore dispersed in the polymer matrix, wherein the micropore includes quantum dots.

To realize the above object, according to one aspect of the present disclosure, there is provided a light-emitting device comprising a quantum dot luminescent material, the quantum dot luminescent material is any one of aforesaid quantum dot luminescent material.

Further, the light-emitting device is a quantum dot film or a quantum dot tube.

According to a further aspect of the present disclosure, there is provided a preparation method of a quantum dot luminescent material, the preparation method includes: mixing the quantum dots, the dissolution medium, the emulsifier, and the polymer precursor in any one aforesaid quantum dot composition to obtain a mixture; curing the mixture to obtain the quantum dot luminescent material.

Further, the curing is heat curing and/or UV curing; preferably, performing the heat curing at 80° C.~150° C. for 15~150 min; preferably, the energy of the UV curing is 500~5000 mj/cm².

Further, performing the mixing by ultrasonic mixing or mechanical stirring.

According to the technical solution of the present disclosure, the dissolution medium in which the quantum dots are dissolved is added to the polymer precursor after first dissolving the quantum dots in the dissolution medium. Since the emulsifier is amphiphilic, with one end connected to the polymer precursor and the other end connected to the dissolution medium, the emulsification of the emulsifier makes the dissolution medium in which the quantum dots are dissolved to form a microemulsion, the microemulsion effectively avoids contact of the quantum dots with the polymer precursor, so that the quantum dots exist inside the microemulsion and are stably dispersed in the polymer precursor, thereby improving the luminous efficiency of the formed quantum dot luminescent material and the aging stability performance of the quantum dots. "Dissolution" of the present disclosure means that the quantum dots are distributed evenly and stably in the dissolution medium, without precipitation, so that maintaining the long-term stable efficiency.

BRIEF DESCRIPTION OF THE DRAWINGS

The accompanying figures of the specification that form part of the application are used to provide a further understanding of the present invention, and the illustrative embodiments of the present invention and the description thereof are intended to explain the present invention and are not intended to limit the present invention. In the figures:

FIG. 2a and FIG. 2b show SEM photographs of a cured quantum dot microemulsion according to an embodiment of the present disclosure; wherein, FIG. 2a shows an SEM photograph of a single microemulsion, while FIG. 2b shows an SEM photograph of microemulsion dispersed in a polymer matrix.

Figure 1:
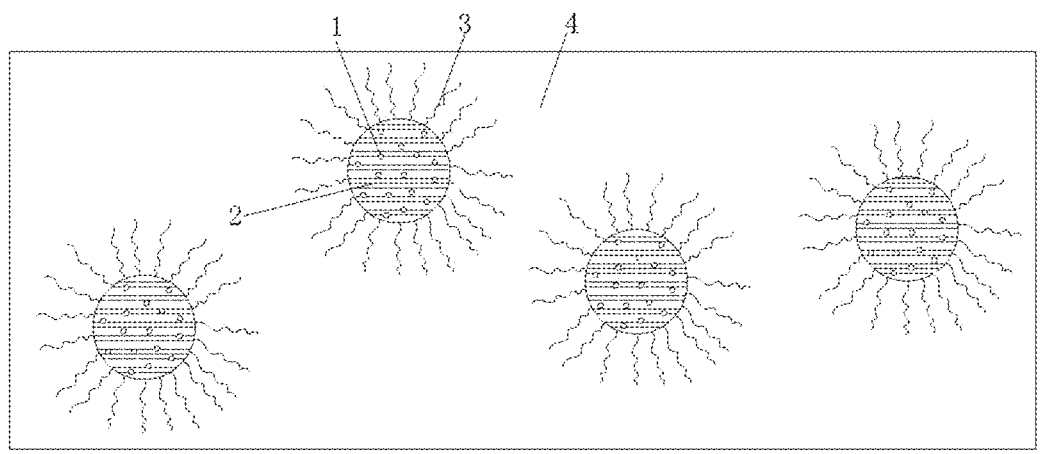
FIG. 1 shows a schematic diagram of the microstructure of a microemulsion-containing quantum dot composition according to an embodiment of the present disclosure.

Wherein, the figures include the following reference numerals:

1. Quantum dots; 2. Dissolution medium; 3. Emulsifier; 4. Polymer precursor;

10. Microemulsion; 11. Polymer matrix.

DETAILED DESCRIPTION

It should be noted that embodiments of the present disclosure and features of embodiments may be combined with each other without conflict. The present disclosure is described in detail in conjunction with embodiments.

The term "polymer precursor" as used in the present application means a substance which can be converted into a crosslinked polymer having a certain molecular weight (generally the polymer has a molecular weight of more than 5,000) by curing such as heat or light curing, and usually includes a mixture of a prepolymer, a diluting monomer, and an optional third curing agent.

HLB value (Hydrophile-Lipophile Balance Number) is called the hydrophilic-lipophilic balance value, also called water oiliness. HLB=hydrophilicity of hydrophilic groups/lipophilicity of lipophilic groups. The larger HLB value represents the stronger the hydrophilicity; the smaller HLB value represents the stronger the lipophilicity.

Unless specifically described to the contrary, a singular form includes a plural form. The expression "a first", "a second", "the first", or "the second" used in various embodiments may be used to refer to various elements regardless of the order and/or the importance but does not limit the corresponding elements.

As mentioned in the background art, in the current quantum dot luminescent materials, the luminous efficiency of the quantum dots is affected to some extent due to the relatively poor compatibility of the quantum dots and the polymer matrix. In order to improve the state of the art, in an exemplary embodiment of the present application, there is provided a quantum dot composition. As shown in FIG. 1, the quantum dot composition includes a microemulsion and a polymer precursor 4 dispersing the microemulsion. The microemulsion includes quantum dots 1, a dissolution medium 2 dissolving the quantum dots, and an emulsifier 3 encapsulating the dissolution medium. The microemulsion in the present application refers to a microstructure having a size of nanometer or micrometer, which is formed under the action of the emulsifier in oil phase and water phase.

In the quantum dot composition provided by the present application, the quantum dots 1 exist in the dissolution medium 2 in a dissolved state, and the emulsifier 3 surrounds the dissolution medium 2 while locating at the interface of the dissolution medium 2 and the polymer precursor 4, it shows affinity to the dissolution medium on one end and the polymer precursor on the other end. The dissolution medium in which the quantum dots are dissolved is uniformly dispersed in the polymer precursor in the form of the microemulsion, and the quantum dots are safely located inside the microemulsion, thereby avoiding the reduced quantum dot efficiency caused by contact of the quantum dots with the polymer precursor. Specifically, the dissolution medium and the polymer precursor have diametrically opposite water/oil solubility. When the dissolution medium is water-soluble, the corresponding polymer precursor is oil-soluble; when the dissolution medium is oil-soluble, the corresponding polymer precursor is water-soluble. Since the emulsifier is amphiphilic, with one end connected to the polymer precursor and the other end connected to the dissolution medium (the emulsifier is connected by non-chemical bond, depending on the attractive force between the groups), the emulsification of the emulsifier makes the dissolution medium in which the quantum dots are dissolved to form the microemulsion, which can effectively avoid contact of the quantum dots with the polymer precursor, making sure that the quantum dots exist inside of the microemulsion and are stably dispersed in the polymer precursor, thereby improving the luminous efficiency of the formed quantum dot luminescent material and the aging stability performance of the quantum dots. "Dissolution" of the present application means that the quantum dots are stably and uniformly distributed in the dissolution medium with no precipitation, so that the long-term and stable efficiency can be maintained. The quantum dot surface of the present application has a protective ligand which has an important influence on the solubility properties of the quantum dots.

In some embodiments, the dissolution medium is a solvent or a reactive monomer. A suitable dissolution medium can be selected according to the solubility of the quantum dots, and it can be the organic solvent or the reactive monomer. The reactive monomer herein may be polymerized by a curing agent under curing conditions, and the formed polymer exists in the quantum dot luminescent material after curing; or the reactive monomer may not be cured and exists as liquid reactive monomer in the quantum dot luminescent material after curing.

Depending on the nature of the quantum dots, different dissolution media and different polymer precursors can be selected to form different quantum dot compositions. In some embodiments, the quantum dots are oil-soluble quantum dots, the solvent is a non-polar organic solvent, the emulsifier is an oil-in-water emulsifier, and the polymer precursor is a water-soluble polymer precursor; in some embodiments, the non-polar organic solvent is selected from one or more of benzene, toluene, xylene, ethyl acetate, n-octane, n-hexane, cyclohexane, n-heptane, dichloromethane, chloroform, dichloroethane and carbon tetrachloride.

In some embodiments, when the quantum dots are oil-soluble quantum dots, according to the "like dissolves like" principle, the dissolution medium of the quantum dots is a non-polar organic solvent, and the non-polar organic solvent can effectively dissolve the oil-soluble quantum dots. The oil-in-water emulsifier has amphiphilic property, being hydrophilic externally and compatible with water-soluble polymer precursor, being lipophilic internally and capable of encapsulating oil-soluble non-polar organic solvent and quantum dots dispersed in that solvent, thereby forming a composition including the water-soluble polymer precursor and the dissolution medium with the emulsifier as a bridge, and the emulsifier encapsulates the dissolution medium to form the microemulsion. "Encapsulating" means that the emulsifier is located at the interface of the dissolution medium and the polymer precursor, and the quantum dots are located in the dissolution medium with high stability. In the composition, the presence of the microemulsion reduces the contact chance between the active groups of the polymer precursor and the quantum dots, thereby reducing the destruction of the quantum dots caused by the active groups, so as to improve the luminous efficiency and aging stability of the quantum dots.

In some embodiments, the dissolution medium of the quantum dots is the solvent, the quantum dots are water-soluble quantum dots, the solvent is a polar organic solvent, the emulsifier is a water-in-oil emulsifier, and the polymer precursor is an oil-soluble polymer precursor; in some embodiments, the polar organic solvent is selected from one or more of methanol, ethanol, propanol, isopropanol, acetone, 2-butanone, tetrahydrofuran, acetonitrile, dimethylformamide, dimethyl sulfoxide and 1,4-dioxane.

Similarly, according to the "like dissolves like" principle, when the quantum dots are water-soluble quantum dots and the solvent is a polar organic solvent, the polar organic solvent can effectively dissolve the water-soluble quantum dots. The water-in-oil emulsifier is also amphiphilic, being hydrophilic internally and compatible with polar organic solvent, being lipophilic externally and compatible with oil-soluble polymer precursor, thereby it may uniformly dispersed in the polymer precursor, in addition, the microemulsion formed under the action of the emulsifier effectively isolates the quantum dots and the polymer precursors, and reduces the destruction of the quantum dots caused by the active groups, such as destruction towards protective ligands on the surface of the quantum dots, and improves the luminous efficiency and aging stability of the quantum dots.

The quantum dot composition formed differs depending on the dissolution medium in which the quantum dots are dissolved. In some embodiments, the dissolution medium is a reactive monomer, the quantum dots are oil-soluble quantum dots, the reactive monomer is an oil-soluble monomer, the microemulsion further contains an optional first curing agent, the emulsifier is an oil-in-water emulsifier, and the polymer precursor is a water-soluble polymer precursor; in some embodiments, the oil-soluble monomer is selected from one or more of methyl acrylate, n-butyl acrylate, isobutyl acrylate, tert-butyl acrylate, isodecyl acrylate, cyclohexyl acrylate, 2-ethylhexyl acrylate, 2-phenoxyethyl acrylate, tetrahydrofuran acrylate, lauryl acrylate, isobornyl acrylate, docosyl acrylate, methyl methacrylate, lauryl methacrylate, 2-ethylhexyl methacrylate, cyclohexyl methacrylate, glycidyl methacrylate, isobornyl methacrylate, and stearyl methacrylate.

In some embodiments, when the dissolution medium is a reactive monomer, the microemulsion may also contain a curing agent. In the preparation of the quantum dot luminescent material, a curing agent is necessary (but the quantum dot composition of the present application may contain no curing agent, a suitable type of curing agent may be added as needed during preparation of the luminescent material), and the curing agent dispersed in the polymer precursor may, depending on their own different properties, enter into the microemulsion. Therefore, whether the dissolution medium of the reactive monomer itself contains a curing agent, or the curing agent added to the polymer precursor, penetrates into the microemulsion containing the reactive monomer, when the curing agent exists, the reactive monomer can be polymerized to form a polymer during the curing process. It should be noted here that the reactive monomer also contains reactive group, however its polarity is similar to the polarity of the protective ligand on the surface of the quantum dots, so the destruction of quantum dots such as fluorescence quenching can be minimized, meanwhile, the reactive monomer can dissolve quantum dots completely. The curing conditions of reactive monomer and polymer precursor may be different, and the reactive monomer can be cured to coat the quantum dots to form quantum dot microspheres.

When the quantum dots are oil-soluble quantum dots and the reactive monomer is an oil-soluble monomer, the oil-soluble monomer can effectively dissolve the oil-soluble quantum dots. The adopted oil-in-water emulsifier is internally compatible with the oil-soluble quantum dots and the oil-soluble monomer, and externally compatible with the water-soluble polymer precursor, thereby forming a quantum dot composition with excellent compatibility, the quantum dots in such composition may have high luminous efficiency and good aging stability.

In other embodiments, the dissolution medium is the reactive monomer, the quantum dots are water-soluble quantum dots, the reactive monomer is a water-soluble monomer, the microemulsion further contains an optional second curing agent, the emulsifier is a water-in-oil emulsifier, and the polymer precursor is an oil-soluble polymer precursor; in some embodiments, the water-soluble monomer is selected from one or more of 2-hydroxyethyl acrylate, 2-hydroxyethyl methacrylate, acrylic acid, methacrylic acid, N-hydroxymethyl acrylamide, 2-hydroxypropyl acrylate, 2-hydroxypropyl methacrylate, N,N-dimethyl acrylamide, and water-soluble epoxy resin.

In some embodiment, the quantum dots are water-soluble quantum dots, and the reactive monomer is a water-soluble monomer. The adopted water-in-oil emulsifier is internally compatible with the water-soluble monomer, and externally compatible with the oil-soluble polymer precursor, thereby forming a quantum dot composition with excellent compatibility, the quantum dots in such composition may have high luminous efficiency and good aging stability. The water-soluble monomer is capable of effectively dissolving water-soluble quantum dots. The presence of the curing agent may be the same as above, and will not be described herein.

In some embodiments, the water-soluble polymer precursor forms a water-soluble polymer matrix after curing, and the specific water-soluble polymer matrix can be appropriately determined according to the type of the water-soluble polymer precursor. In some embodiments, the water-soluble polymer precursor forms a water-soluble polymer matrix after curing, and the water-soluble polymer matrix is selected from one or more of a water-soluble organosilicone resin, a water-soluble epoxy resin, a water-soluble acrylic resin, and a water-soluble polyurethane resin. These water-soluble polymer matrixes have a wide range of applications, excellent water and oxygen barrier properties and weatherability, as well as outstanding aging stability.

In some embodiments, the emulsifier may be a suitable oil-in-water emulsifier or water-in-oil emulsifier according to actual needs, and the specific kind thereof is not particularly limited in the present application. In some embodiments, the oil-in-water emulsifier has an HLB value ranging from 8 to 18; in some embodiments, the oil-in-water emulsifier is selected from one or more of sodium oleate, polyoxyethylene monostearate, polyoxyethylene lauryl ether, polyoxyethylene sorbitan monolaurate, polyoxyethylene oleyl ether, polyoxyethylene sorbitol lanolin derivative, polyoxyethylene oxypropylene stearate, polyoxyethylene cetyl alcohol, polyethylene glycol monopalmitate, polyoxyethylene fatty alcohol, polyoxyethylene oleyl alcohol, polyoxyethylene stearyl alcohol, polyoxyethylene oleyl ether, polyoxyethylene sorbitan monooleate, polyoxyethylene oleyl ether, polyoxyethylene vegetable oil, polyoxyethylene alkyl phenol, polyoxyethylene monooleate, hexaethylene glycol monostearate, and polyoxypropylene stearate.

The larger HLB value represents the stronger hydrophilicity; the smaller HLB value represents the stronger lipophilicity. The oil-in-water emulsifier with an HLB value ranging from 8 to 18 can effectively change oil-soluble quantum dots and the dissolution medium into microemulsion form, effectively separating the water-soluble polymer precursor from the oil-soluble quantum dots and reducing the destruction of oil-soluble quantum dots caused by water-soluble polymer precursor. The preferred specific type of oil-in-water emulsifier has a wide range of applications, and can efficiently and rapidly form the microemulsion, generating a relatively stable microemulsion, with excellent emulsifying property.

In some embodiments, the oil-soluble polymer precursor forms an oil-soluble polymer matrix after curing, and the specific type of the oil-soluble polymer matrix can be appropriately selected from the conventional polymer matrixes. In some embodiments, the oil-soluble polymer precursor forms an oil-soluble polymer matrix after curing, and the oil-soluble polymer matrix is selected from one or more of an oil-soluble organosilicone resin, an oil-soluble epoxy resin, an oil-soluble acrylic resin, and an oil-soluble polyurethane resin. These oil-soluble polymer matrixes have a wide range of applications, excellent water and oxygen barrier properties and weatherability, as well as outstanding aging stability.

In some embodiments, the water-in-oil emulsifier can also be optimally selected according to actual needs. In some embodiments, the water-in-oil emulsifier has an HLB value ranging from 3 to 6; in some embodiments, the water-in-oil emulsifier is selected from one or more of propylene glycol monostearate, glyceryl monostearate, hydroxylated lanolin, propylene glycol fatty acid ester, sorbitan monooleate, propylene glycol monolaurate, propylene glycol fatty acid ester, sorbitan monostearate, diethylene glycol monooleate, diethylene glycol fatty acid ester, diethylene glycol monostearate, polyoxyethylene oley ether, diethylene glycol fatty acid ester, glyceryl monostearate, and polyoxyethylene sorbitol beeswax derivative.

In some embodiments, the water-in-oil emulsifier with an HLB value ranging from 3 to 6 can effectively change the water-soluble quantum dots and the dissolution medium thereof into the microemulsion form, which effectively isolating the oil-soluble polymer precursor from the water-soluble quantum dots, and reducing the destruction of water-soluble quantum dots caused by the oil-soluble polymer precursor. The preferred specific type of water-in-oil emulsifier has a wide range of applications, and can efficiently and rapidly form the microemulsion, generating a relatively stable microemulsion, with excellent emulsifying property.

In the quantum dot composition of the present application, the ratio of the quantum dots to the polymer precursor can be reasonably determined according to the luminescence requirement of the luminescent material. In some embodiments, in the quantum dot composition, the mass ratio of the quantum dots dissolved in the dissolution medium to the polymer precursor is 1~20:100; in some embodiments, the mass ratio of the emulsifier to the polymer precursor is 0.1~10:100. Within this ratio range, the microemulsion can be effectively formed.

In the quantum dot composition, the emulsifier functions to form the microemulsion to isolate the quantum dots from the polymer precursor. Thus, the amount of emulsifier also varies depending on the amount of quantum dots. In some embodiments, the mass ratio of the emulsifier to the sum of the quantum dots and the dissolution medium is 10~30:100. Controlling the mass ratio of the two can effectively exert the emulsification effect of the emulsifier and form stable microemulsion.

In the quantum dot composition, the first or second or third curing agent is a radical photocuring agent, a cationic photocuring agent and/or a heat curing agent, and the first or second or third curing agent may be the same.

Specific types of the radical photocuring agent include, but are not limited to, any one or more of 1-hydroxycyclohexyl phenyl ketone (Photoinitiator 184), 2-methyl-1-[4-methylthiophenyl]-2-morpholino-propane-1-one (Photoinitiator 907), 2-hydroxy-methylphenylpropan-1-one (Photoinitiator 1173), 2,4,6-trimethylbenzoyl diphenylphosphine oxide (Photoinitiator TPO), phenylbis(2,4,6-trimethylbenzoyl)phosphine oxide (Photoinitiator 819), 2-Benzyl-2-(dimethylamino)-4'-morpholinobutyrophenone (Photoinitiator 369), α,α-dimethoxy-α-phenyl acetophenone (Photoinitiator 651), benzophenone (Photoinitiator BP), and methyl benzoyl formate (Photoinitiator MBF).

Specific types of the cationic photocuring agent include, but are not limited to, any one or more of 4,4'-dimethyl diphenyl iodonium salt hexafluorophosphate, bis(4-tert-butylphenyl)iodonium hexafluorophosphate, bis (4-tert-butylphenyl)iodonium trifluoromethanesulfonate, cyclopropyldiphenylsulfonium tetrafluoroborate, diphenyl iodonium hexafluorophosphate, diphenyl iodonium arsenate, diphenyl iodonium trifluoromethanesulfonate, triphenyl thiotetrafluoroborate, triphenyl sulfonium bromide, and tri-p-tolylsulfonium hexafluorophosphate.

Specific types of the heat curing agent include, but are not limited to, any one or more of ethylenediamine, diethylenetriamine, polyethene polyamine, dipropylenetriamine, m-phenylenediamine, diaminodiphenylsulfone, hydroxyethyl ethylenediamine, benzophenone tetracarboxylic dianhydride, tetrahydrophthalic anhydride, glutaric anhydride, methylhexahydrophthalic anhydride, pyromellitic anhydride, 2-methylimidazole, and 2-ethylimidazole. The curing agents have the advantages of wide applicability, fast curing speed, high curing efficiency, etc., and the combined use has a certain synergistic effect to obtain a cured product with good performance.

In actual production, depending on the performance requirements of the prepared light-emitting device, the quantum dot composition may further include a component for improving its performance to further enhance the luminous efficiency and the light-emitting stability of the quantum dots in the light-emitting device. In some embodiments of the present disclosure, the quantum dot composition may further include an additive which is a light diffusion particle and/or an antioxidant. The light diffusion particle may be selected from conventional light diffusing materials, including but not limited to, in the present disclosure, any one or more of $TiO_2$, $Zr_2O_3$, ZnO, $Al_2O_3$, $BaSO_4$, $CaCO_3$, $SiO_2$, and organosilicone. Light diffusion particle can effectively improve the luminous efficiency of quantum dots, while antioxidant helps to resist oxidation and prolong the stability of quantum dot luminescent material. The light diffusion particles have a good light diffusion effect and can effectively improve the light-emitting efficiency of the quantum dot luminescent material.

Antioxidant includes, but are not limited to, any one or more of 4-hydroxydodecanoic acid anilide, N,N'-hexamethylenebis-3(3,5-di-tert-butyl-4-hydroxyphenyl)propanamide, 4,4-di-tert-octyldiphenylamine, 2,6-di-tert-butyl-p-cresol (BHT), β-(3,5-di-tert-butyl-4-hydroxyphenyl)propanoic acid stearyl ester (Antioxidant 1076), tetrakis[β-(3,5-di-tert-butyl-4-hydroxyphenyl)propionic acid]pentaerythritol ester (Antioxidant 1010), tris[2,4-di-tert-butylphenyl]phosphite ester (Antioxidant 168), bis(2,4-di-tert-butylphenol) pentaerythritol diphosphite (Antioxidant 626), and pentaerythritol diphosphite dioctadecyl ester (Antioxidant 618). These antioxidants have a good anti-oxidation effect and can effectively inhibit the yellowing and degradation of the polymer matrix. Moreover, the combined use of hindered phenols and phosphite antioxidants can achieve a certain synergistic effect to have a better anti-oxidation effect.

In the quantum dot composition of the present application, the polymer precursor refers to a mixture of components before curing to form the polymer matrix, and specifically includes a prepolymer, a diluting monomer, and an optional third curing agent. The polymer precursor herein can be directly purchased from the market, and whether or not the curing agent is contained is depending on the commercially available product. When the polymer precursor does not contain a curing agent, during the time that the quantum dot luminescent material is prepared using the polymer precursor, a suitable curing agent can be selected for curing under curing conditions.

In a second exemplary embodiment of the present application, there is provided a quantum dot luminescent material, and the quantum dot luminescent material is prepared according to any of the quantum dot compositions. The luminescent material prepared by the quantum dot composition of the present application has the advantages of high luminous efficiency and good aging stability.

Figure 2A:
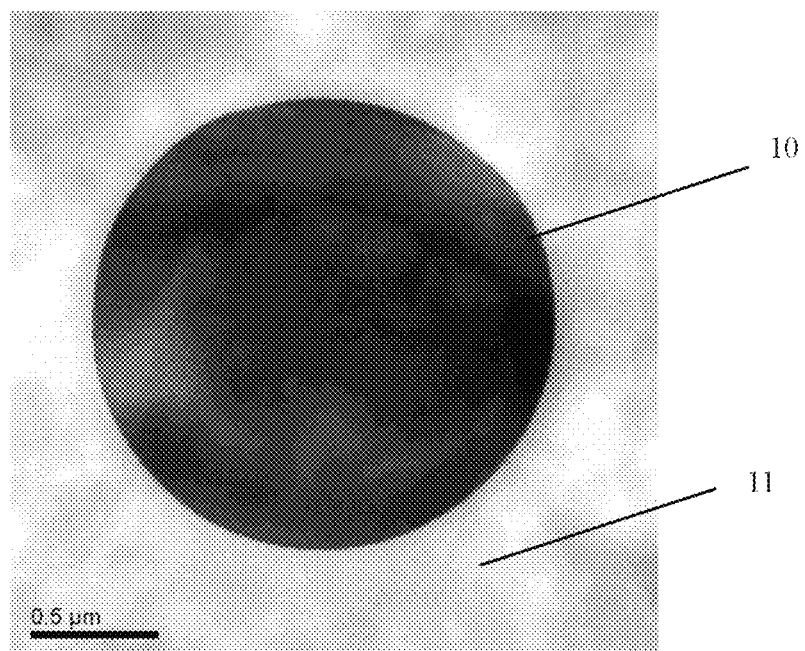
Figure 2B:
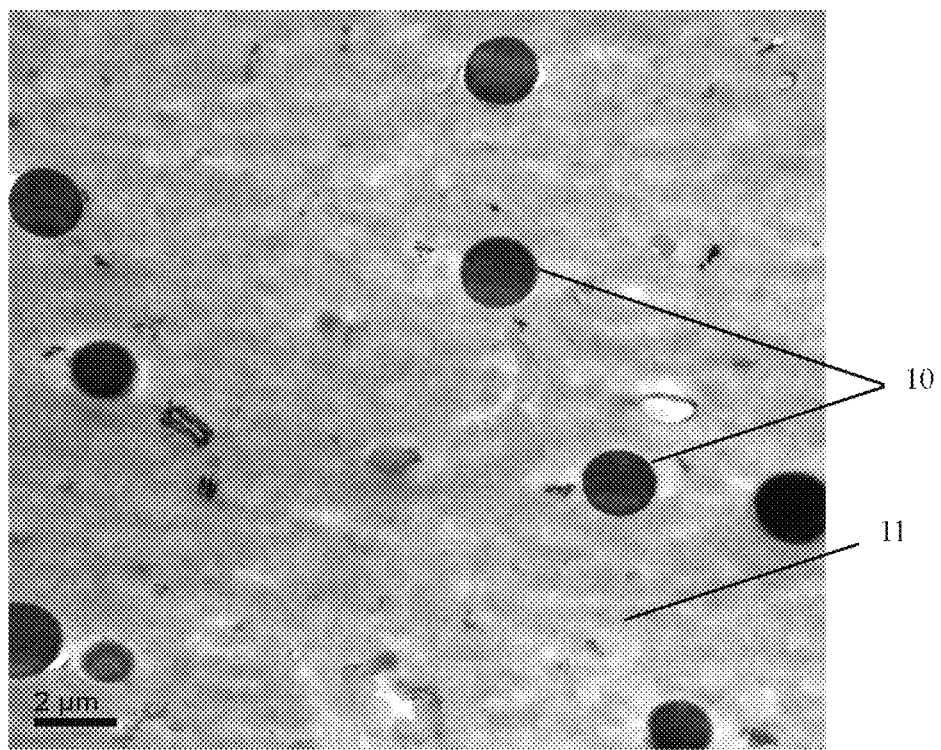

In a third exemplary embodiment of the present application, there is provided a quantum dot luminescent material, and the quantum dot luminescent material includes a polymer matrix 11 and a microemulsion 10 dispersed in the polymer matrix (as shown in FIG. 2a or FIG. 2b), wherein, the microemulsion includes an emulsifier and an emulsifier-coated dissolution medium where quantum dots are dissolved.

In some embodiments, the dissolution medium is selected from a solvent or a reactive monomer. When the dissolution medium is a solvent, the luminescent material may slowly volatilize during use, which does not affect the stability of the luminescent material.

In a fourth exemplary embodiment of the present application, there is provided a quantum dot luminescent material, and the quantum dot luminescent material includes a polymer matrix 11 and a microemulsion 10 dispersed in the polymer matrix (as shown in FIG. 2a or FIG. 2b), wherein, the microemulsion includes quantum dots, a polymer dispersing the quantum dots, and an emulsifier encapsulating the polymer, and the polymer is formed by polymerization of a reactive monomer.

In a fifth exemplary embodiment of the present application, there is provided a quantum dot luminescent material, and the quantum dot luminescent material includes a polymer matrix and a micropore dispersed in the polymer matrix, wherein, the micropore includes quantum dots. When the quantum dot luminescent material is prepared by using a quantum dot composition in which a dissolution medium is used as a solvent, the solvent reduction by volatilization is controlled by controlling the curing process of polymer precursor, and the solvent is controlled to totally volatilized after the polymer precursor is cured into the polymer matrix. At this time, a plurality of micropores are formed inside the polymer matrix, and the quantum dots remain in the micropores. In some embodiments, the volatilization or curing process is carried out under an inert gas atmosphere to prevent air from entering the interior of the polymer matrix to affect the quantum dots.

The quantum dot luminescent material provided in aforesaid embodiments, through microemulsion formed by encapsulating of the emulsifier, can effectively reduce the destruction of the quantum dots caused by active groups in the polymer precursor before curing, thereby improving the luminous efficiency and aging stability of the quantum dots. In some embodiments, the dissolution medium is selected from a solvent or a reactive monomer.

In a sixth exemplary embodiment of the present application, there is provided a light-emitting device comprising a quantum dot luminescent material, wherein, the quantum dot luminescent material is any one of aforesaid quantum dot luminescent materials. The light-emitting device has the advantages of high luminous efficiency and good aging stability. The light-emitting device may be an electroluminescent or a photoluminescent device, and the specific emitted color of the quantum dots may be appropriately selected according to actual application needs. The quantum dots may be selected from one or more of red quantum dots, green quantum dots, and blue quantum dots. Photoluminescent quantum dot devices containing red quantum dots and green quantum dots can be applied in the display field. Under the excitation of blue LED light, red and green quantum dots can absorb blue light and convert it into red light and green light which together with the unabsorbed blue light forming a RGB white light field. Due to the narrow half-peak width of the red and green quantum dots, the quantum dot display product has a higher color gamut and a higher color saturation than conventional liquid crystal display.

The quantum dot light-emitting device may be a quantum dot film or a quantum dot tube according to actual needs. The quantum dot film can be formed by curing reactants of a quantum dot luminescent material on a substrate. In a specific application, the upper or lower layer of the quantum dot film may further have a water and oxygen barrier film or a protective film including a polymer film, or it may have other layers such as a metal oxide layer for blocking water and oxygen between the quantum dot film and the polymer film. The quantum dot tube product can be obtained by curing a quantum dot composition in the inner cavity of the tube to form the quantum dot luminescent material, both of quantum dot film and quantum dot tube can be used in a light conversion device for a backlight system of display. The quantum dot film or quantum dot tube has the advantages of high luminous efficiency and good aging stability.

In a seventh exemplary embodiment of the present application, there is provided a preparation method of a quantum dot luminescent material, which includes: mixing the dissolution medium where the quantum dots are dispersed, together with the emulsifier and the polymer precursor of any of aforesaid quantum dot compositions to obtain a mixture; curing the mixture to obtain a quantum dot luminescent material. In the preparation of the mixture, the addition order of each material is not limited. In some embodiments, the quantum dots, the dissolution medium and the emulsifier are added together to the polymer precursor, so as to reduce the contact time of the quantum dots and the polymer precursor.

In the preparation method of the quantum dot luminescent material, by adding the emulsifier in the composition, the dissolution medium can be effectively compatible with the emulsifier, so that the emulsifier encapsulates and changes the dissolution medium into microemulsions, and the quantum dots are located in each microemulsion, the contact chance between the quantum dots and the active groups in the polymer precursor is reduced, thereby reducing the destruction of the quantum dots caused by the active groups, so that the luminous efficiency and aging stability of the prepared quantum dot luminescent material is improved. The formation of the microemulsion promotes the aging stability of the quantum dot luminescent material.

In the preparation method, the curing method varies according to the dissolution medium dispersing quantum dots and the polymer precursor. In some embodiments, the curing is heat curing and/or UV curing; in some embodiments, the curing is performed at 80° C.~150° C. for 15 to 150 minutes; in some embodiments, the UV curing energy is 500~5000 mj/cm².

When the dissolution medium in the quantum dot composition is the solvent, and the polymer precursor can only be cured by heat, making sure that the solvent volatilization in the microemulsion is minimized as much as possible during the heat curing, thereby maintaining the presence of the microemulsion, so it is necessary to select a suitable curing temperature; after the polymer precursor is cured, the active groups which may affect the quantum dots are almost completely reacted. Therefore, after the polymer matrix is formed, the polymer matrix has little effect on the stability of the quantum dots, so at this point, a continued solvent volatilization will not have an adverse effect on quantum dots. After the polymer precursor is completely cured, whether the solvent is completely volatilized on purpose or a natural volatilization occurs during use, the properties of luminescent materials will not be affected. When the dissolution medium in the quantum dot composition is the solvent, and the polymer precursor does not need to be cured by heat, the ultraviolet curing method with less heat generation can be selected for curing. When the dissolution medium is the reactive monomer, the polymer precursor may be selected from heat curing or ultraviolet curing. When the dissolution medium is a reactive monomer, the polymer precursor can be cured by either heat or ultraviolet.

It should be noted here that when the reactive monomer dissolution medium includes no curing agent in the quantum dot composition (preferably with no curing agent, reducing the effect of curing agent on the quantum dots), the curing agent dissolved in the polymer precursor is less likely to penetrate into the microemulsion. When the curing agent does not penetrate into the microemulsion, or when the curing conditions are not appropriate for it, the curing process only cures the polymer precursor into the polymer matrix, and the microemulsion remains unchanged. For example, the curing agent for the polymer precursor is an ultraviolet curing agent, and curing agent for the reactive monomer is a heat curing agent, so even if the curing agent enters into the microemulsion, since curing is conducted under ultraviolet irradiation, the reactive monomer will remain uncured.

In the preparation method, for the sake of faster and better formation of the microemulsion, the mixing step uses an ultrasonic mixing or a rapid mechanical stirring (for example, the stirring rate is set to 1000 rpm or more according to the stirring capacity of the stirring device), more homogeneous mixing may lead to more uniform microemulsions, in addition, the faster formation of microemulsion is beneficial to reduce the contact time of the quantum dots and the polymer precursor.

When the dissolution medium dispersing the quantum dots is the organic solvent, by controlling the temperature and/or time of the heat curing, or by application of UV curing, the organic solvent in the microemulsion can be incompletely volatilized, that is, in the case the organic solvent disperses the quantum dots, the microemulsion is in a liquid state. Under this condition, the microemulsion cannot be cured. When the dissolution medium dispersing the quantum dots is the reactive monomer, the reactive monomer in the microemulsion may be in liquid form if the curing condition is not satisfied; or the polymer may be formed when the curing condition is achieved, and the formed polymer is in the form of quantum dot microsphere in the luminescent material. That is to say, in the quantum dot luminescent material, the reactive monomer can be cured or not cured depending on the curing conditions. Usually, the curing in the preparation process mainly aims at the polymer precursor.

In the quantum dot composition, quantum dot luminescent material and quantum dot light-emitting device of the present application, the quantum dots are single-type quantum dots or doped quantum dots, and in some embodiments, the doped quantum dots are core-shell quantum dots or alloyed quantum dots. The microemulsion includes a plurality of quantum dots, and the central wavelength of the luminescent spectrum of each of the quantum dots may be the same or different.

Advantageous effects of the present application will be further described below in conjunction with specific embodiments.

Embodiment 1

A polymer precursor (materials before curing include: prepolymer, diluent and curing agent), an emulsifier and CdSe/CdS quantum dot solution (mixing quantum dots with the dissolution medium) were prepared; the emulsifier and the quantum dot solution were added to the polymer precursor to form a mixture having microemulsions after mixing at 1000 rpm for 20 min; the mixture was cured to obtain a quantum dot luminescent material.

The raw materials in the mixture are shown in Table 1. The ratio of the raw materials and the specific reaction conditions are shown in Table 2.

Embodiments 2 to 8

Embodiments 2 to 8 adopted the same steps as Embodiment 1, and their preparation parameters and conditions are shown in Tables 1 and 2.

Comparative Embodiments 1 and 2

No emulsifier, other parameters are shown in Table 1 and Table 2.

TABLE 1

Types of raw materials used in each embodiment and each comparative embodiment

| | Polymer precursor | | | | | | Dissolution |
|---|---|---|---|---|---|---|---|
| Embodiment | Prepolymer | Diluent | Curing agent | Polymer matrix | Quantum dots | Emulsifier | medium |
| 1 | Polyurethane acrylate prepolymer | 2-hydroxyethyl acrylate | Photoinitiator TPO | Water-soluble polyurethane acrylate | Oil-soluble quantum dots | Polyoxyethylene monostearate | Toluene |
| 2 | Polyester acrylate prepolymer | N,N-dimethyl acrylamide | Photoinitiator 819 | Water-soluble polyester acrylates | Oil-soluble quantum dots | Polyoxyethylene octadecanol | Cyclohexyl acrylate |

TABLE 1-continued

Types of raw materials used in each embodiment and each comparative embodiment

| Embodiment | Prepolymer | Diluent | Curing agent | Polymer matrix | Quantum dots | Emulsifier | Dissolution medium |
|---|---|---|---|---|---|---|---|
| 3 | Polyurethane acrylate prepolymer | Isobornyl acrylate | Photoinitiator TPO | Oil-soluble polyurethane acrylate | Water-soluble quantum dots | Sorbitan monooleate | Methanol |
| 4 | Polyester acrylate prepolymer | 2-ethylhexyl methacrylate | Photoinitiator 819 | Oil-soluble polyester acrylate | Water-soluble quantum dot | Polyoxyethylene sorbitol beeswax derivative | 2-hydroxyethyl acrylate |
| 5 | Bisphenol A epoxy resin | Phenyl glycidyl ether | Diethylenetriamine | Water-soluble bisphenol A epoxy resin | Oil-soluble quantum dots | Polyallyl stearate | n-hexane |
| 6 | Bisphenol A epoxy resin | Glycol diglycidyl ether | m-xylylenediamine | Water-soluble bisphenol A epoxy resin | Oil-soluble quantum dots | Polyoxyethylene monooleate | 2-ethylhexyl methacrylate |
| 7 | Bisphenol F epoxy resin | Phenyl glycidyl ether | Diethylenetriamine | Oil-soluble bisphenol F epoxy resin | Water-soluble quantum dots | Propylene glycol monostearate | Isopropanol |
| 8 | Bisphenol F epoxy resin | Glycol diglycidyl ether | m-xylylenediamine | Oil-soluble bisphenol F epoxy resin | Water-soluble quantum dots | Diethylene glycol fatty acid ester | N,N-dimethyl acrylamide |
| 9 | Bisphenol A epoxy resin | Phenyl glycidyl ether | diethylenetriamine | Water-soluble bisphenol A epoxy resin | Oil-soluble quantum dots | Polyoxypropylene stearate | n-hexane |
| Comparative Embodiment 1 | Polyurethane acrylate prepolymer | 2-hydroxyethyl acrylate | Photoinitiator TPO | Water-soluble polyurethane acrylate | Oil-soluble quantum dots | / | Toluene |
| Comparative Embodiment 2 | Polyester acrylate prepolymer | N,N-dimethyl acrylamide | Photoinitiator 819 | Water-soluble polyester acrylate | Oil-soluble quantum dots | / | Cyclohexyl acrylate |

TABLE 2

Preparation conditions of each embodiment and each comparative embodiment

| | HLB value of emulsifier | $M_{quantum\ dots}$ : $M_{polymer precursor}$ | $M_{emulsifier}$ : $M_{polymer precursor}$ | $M_{emulsifier}$ : $M_{dissolution medium+quantum dots}$ | Curing conditions |
|---|---|---|---|---|---|
| Embodiment 1 | 17.9 | 1:100 | 0.1:100 | 10:100 | 365 nm UV 500 mj/cm² |
| Embodiment 2 | 15.3 | 20:100 | 10:100 | 30:100 | 365 nm UV 5000 mj/cm² |
| Embodiment 3 | 4.7 | 5:100 | 0.5:100 | 12:100 | 365 nm UV 1000 mj/cm² |
| Embodiment 4 | 5.0 | 10:100 | 1:100 | 15:100 | 365 nm UV 2500 mj/cm² |
| Embodiment 5 | 8.0 | 15:100 | 2:100 | 18:100 | 120° C., 45 min |
| Embodiment 6 | 11.4 | 8:100 | 4:100 | 20:100 | 150° C., 15 min |
| Embodiment 7 | 3.4 | 12:100 | 5:100 | 24:100 | 100° C., 90 min |
| Embodiment 8 | 6.1 | 18:100 | 8:100 | 25:100 | 80° C., 150 min |
| Embodiment 9 | 8.0 | 15:100 | 2:100 | 18:100 | 120° C., 45 min |
| Comparative Embodiment 1 | / | 1:100 | / | / | 365 nm UV 500 mj/cm² |
| Comparative Embodiment 2 | / | 20:100 | / | / | 365 nm UV 5000 mj/cm² |

Note:
The quantum dot luminescent material of Embodiment 9 is further heated in 120° C. for 45 min, completely volatilizing the solvent in the microemulsions to form micropores.

Detection:

The properties of the quantum dot luminescent materials prepared in the embodiments and comparative embodiments were tested. The specific detection methods are as follows, and the detection results are shown in Table 3.

The detection method of quantum dot luminous efficiency is as follows:

using a 450 nm blue LED lamp as a backlight source, using an integrating sphere to respectively test the spectrum of blue backlight and the spectrum after passing through the quantum dot luminescent material, and calculating the luminescence efficiency of quantum dots by using the integral area of the spectrum.

Quantum dot luminous efficiency=quantum dot emission peak area/(blue backlight peak area−blue peak area that is not absorbed through the quantum dot luminescent material) *100%.

The detection method of light-emitting stability is: the test method of light-emitting stability mainly includes the detection of the efficiency changes of the quantum dot luminescent material under aging conditions such as high temperature and blue light radiation (70° C., 0.5 w/cm$^2$), high temperature and high humidity (65° C., 95% relative humidity) and high temperature storage (85° C.).

TABLE 3

|  | | Efficiency after 1000 hour aging | | |
| --- | --- | --- | --- | --- |
|  | Initial efficiency | High temperature blue light | High temperature and high humidity | High temperature storage |
| Embodiment 1 | 108.7% | 109.9% | 96.8% | 102.3% |
| Embodiment 2 | 106.9% | 108.0% | 95.2% | 100.5% |
| Embodiment 3 | 109.4% | 110.6% | 97.5% | 102.9% |
| Embodiment 4 | 107.5% | 108.7% | 95.8% | 101.1% |
| Embodiment 5 | 105.1% | 106.2% | 93.6% | 98.8% |
| Embodiment 6 | 104.6% | 105.7% | 93.1% | 98.4% |
| Embodiment 7 | 106.8% | 107.9% | 95.1% | 100.5% |
| Embodiment 8 | 105.9% | 107.0% | 94.3% | 99.6% |
| Embodiment 5 | 105.2% | 107.2% | 94.2% | 99.1% |
| Comparative Embodiment 1 | 100.0% | 98.3% | 79.5% | 82.6% |
| Comparative Embodiment 2 | 98.4% | 95.6% | 76.9% | 80.3% |

Note:
The efficiency is a relative efficiency; the efficiency of Comparative Example 1 is set as 100%, and other efficiencies are relatively calculated.

From the aforesaid description, it can be seen that the embodiments of the present disclosure achieve the following technical effects: dispersing quantum dots by selecting a solvent or a reactive monomer, adding a quantum dot solution or a mixture of quantum dot and reaction monomer to the polymer matrix, these process form quantum dot microemulsions under the action of the emulsifier due to the incompatibility of the quantum dot solution and the mixture of quantum dot reaction monomer with the polymer matrix; since the quantum dots are concentrated in the dissolution medium of the microemulsions, it reduces the contact between the quantum dots and the polymer precursor, and improves the luminescence efficiency and aging stability of the quantum dots.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A quantum dot composition, comprising: a microemulsion and a polymer precursor dispersing said microemulsion, wherein said microemulsion comprises quantum dots, a dissolution medium dissolving said quantum dots, and an emulsifier encapsulating said dissolution medium.

2. The quantum dot composition according to claim 1, wherein said dissolution medium is a solvent or a reactive monomer.

3. The quantum dot composition according to claim 2, wherein said dissolution medium is the solvent, said quantum dots are oil-soluble quantum dots, said solvent is a non-polar organic solvent, said emulsifier is an oil-in-water emulsifier, and said polymer precursor is a water-soluble polymer precursor.

4. The quantum dot composition according to claim 3, wherein said water-soluble polymer precursor forms a water-soluble polymer matrix after curing, and said water-soluble polymer matrix is selected from one or more of a water-soluble organosilicone resin, a water-soluble epoxy resin, a water-soluble acrylic resin, and a water-soluble polyurethane resin.

5. The quantum dot composition according to claim 3, wherein said oil-in-water emulsifier has an HLB value ranging from 8 to 18.

6. The quantum dot composition according to claim 2, wherein said dissolution medium is the solvent, said quantum dots are water-soluble quantum dots, said solvent is a polar organic solvent, said emulsifier is a water-in-oil emulsifier, and said polymer precursor is an oil-soluble polymer precursor.

7. The quantum dot composition according to claim 6, wherein said oil-soluble polymer precursor forms an oil-soluble polymer matrix after curing, and said oil-soluble polymer matrix is selected from one or more of an oil-soluble organosilicone resin, an oil-soluble epoxy resin, an oil-soluble acrylic resin, and an oil-soluble polyurethane resin.

8. The quantum dot composition according to claim 6, wherein said water-in-oil emulsifier has an HLB value ranging from 3 to 6.

9. The quantum dot composition according to claim 2, wherein said dissolution medium is the reactive monomer, said quantum dots are oil-soluble quantum dots, said reactive monomer is an oil-soluble monomer, said microemulsion further comprises an optional first curing agent, said emulsifier is an oil-in-water emulsifier, and said polymer precursor is a water-soluble polymer precursor.

10. The quantum dot composition according to claim 9, wherein said water-soluble polymer precursor forms a water-soluble polymer matrix after curing, and said water-soluble polymer matrix is selected from one or more of a water-soluble organosilicone resin, a water-soluble epoxy resin, a water-soluble acrylic resin, and a water-soluble polyurethane resin.

11. The quantum dot composition according to claim 9, wherein said oil-in-water emulsifier has an HLB value ranging from 8 to 18.

12. The quantum dot composition according to claim 2, wherein said dissolution medium is the reactive monomer, said quantum dots are water-soluble quantum dots, said reactive monomer is a water-soluble monomer, said microemulsion further comprises an optional second curing agent, said emulsifier is a water-in-oil emulsifier, and said polymer precursor is an oil-soluble polymer precursor.

13. The quantum dot composition according to claim 12, wherein said oil-soluble polymer precursor forms an oil-soluble polymer matrix after curing, and said oil-soluble polymer matrix is selected from one or more of an oil-soluble organosilicone resin, an oil-soluble epoxy resin, an oil-soluble acrylic resin, and an oil-soluble polyurethane resin.

14. The quantum dot composition according to claim 12, wherein said water-in-oil emulsifier has an HLB value ranging from 3 to 6.

15. The quantum dot composition according to claim 1, wherein the mass ratio of said quantum dots to said polymer precursor is 1~20:100 in said quantum dot composition.

16. The quantum dot composition according to claim 15, wherein the mass ratio of said emulsifier to the sum of said dissolution medium and said quantum dots is 10~30:100.

17. The quantum dot composition according to claim 1, wherein said polymer precursor comprises a prepolymer, a diluting monomer, and an optional third curing agent.

18. A quantum dot luminescent material, wherein said quantum dot luminescent material comprises a polymer matrix and a microemulsion dispersed in said polymer matrix, wherein, said microemulsion comprises quantum dots, a dissolution medium dissolving said quantum dots, and an emulsifier encapsulating said dissolution medium.

19. The quantum dot luminescent material according to claim 18, wherein said dissolution medium is selected from the group consisting of a solvent and a reactive monomer.

20. A light-emitting device comprising a quantum dot luminescent material, wherein said quantum dot luminescent material is the quantum dot luminescent material according to claim 18.

\* \* \* \* \*